United States Patent [19]

Pierro et al.

[11] Patent Number: 5,517,747
[45] Date of Patent: May 21, 1996

[54] METHOD AND APPARATUS FOR THE INTERCONNECTION OF RADIO FREQUENCY (RF) MONOLITHIC MICROWAVE INTEGRATED CIRCUITS

[75] Inventors: John A. Pierro, East Meadow; Thomas H. Graham, Lindenhurst; Scott M. Weiner, Wantagh; Paul Heller, Dix Hills; Joseph L. Merenda, Massapequa, all of N.Y.

[73] Assignee: AIL Systems, Inc., Deer Park, N.Y.

[21] Appl. No.: 365,676

[22] Filed: Dec. 29, 1994

Related U.S. Application Data

[62] Division of Ser. No. 985,570, Dec. 3, 1992, Pat. No. 5,402,088.

[51] Int. Cl.$^6$ ................................................ H01P 11/00
[52] U.S. Cl. .............................. 29/600; 29/850; 174/250; 174/251; 361/748
[58] Field of Search ...................... 29/850, 600; 174/250, 174/251; 361/748

[56] References Cited

U.S. PATENT DOCUMENTS

| | | | |
|---|---|---|---|
| 4,611,186 | 9/1986 | Ziegner . | |
| 4,626,805 | 12/1986 | Jones . | |
| 4,646,436 | 3/1987 | Crowell et al. | 29/850 |
| 4,669,805 | 6/1987 | Kosugi et al. . | |
| 4,679,321 | 7/1987 | Plonski | 29/850 |
| 4,724,409 | 2/1988 | Lehman . | |
| 4,908,939 | 3/1990 | Shieber et al. | 29/850 |
| 5,233,133 | 8/1993 | Iwasaki et al. . | |
| 5,323,534 | 6/1994 | Iwasaki et al. | 29/850 |

FOREIGN PATENT DOCUMENTS

| | | |
|---|---|---|
| 2-237302 | 9/1990 | Japan . |
| 2193848 | 2/1988 | United Kingdom . |
| WO92/13369 | 8/1992 | WIPO . |

OTHER PUBLICATIONS

Caccoma and Nurczynski, Interface of Strip Line to Coaxial Cable, *IBM Technical Disclosure Bulletin*, 13(2): 526–527 (1970).

European Search Report for related European Application EP 93 30 9202.

*Primary Examiner*—Carl J. Arbes
*Attorney, Agent, or Firm*—Hoffmann & Baron

[57] ABSTRACT

A coaxial-to-coplanar waveguide connector is used for interconnecting stripline compatible devices utilizing coaxial cable. The connector is formed at the end of a length of coaxial cable embedded within a circuit board. The connector generally has a substantially semi-circular connection section. The connection section includes a conductor partly surrounded by an electrically insulative dielectric which is partly surrounded by a shield. An electrically conductive sheet is used to couple the shield to a ground plane of the circuit board. Electrically conductive ribbon is connect the conductor to a stripline compatible device. The coaxial-to-coplanar waveguide connector may be fabricated by coating a dielectric board with an adhesive material and then routing a length of miniature coaxial cable in the adhesive. Conductive material and dielectric material are consecutively laid upon the dielectric cable board. A portion of the board including a section of miniature coaxial cable is milled so as to remove a top portion of the cable. An electrically conductive material is coupled to the coaxial shield in order to connect the shield to a ground plane of the circuit board and the stripline compatible device. Furthermore, an additional electrically conductive ribbon is operatively connected from the conductor to the stripline compatible device.

4 Claims, 10 Drawing Sheets

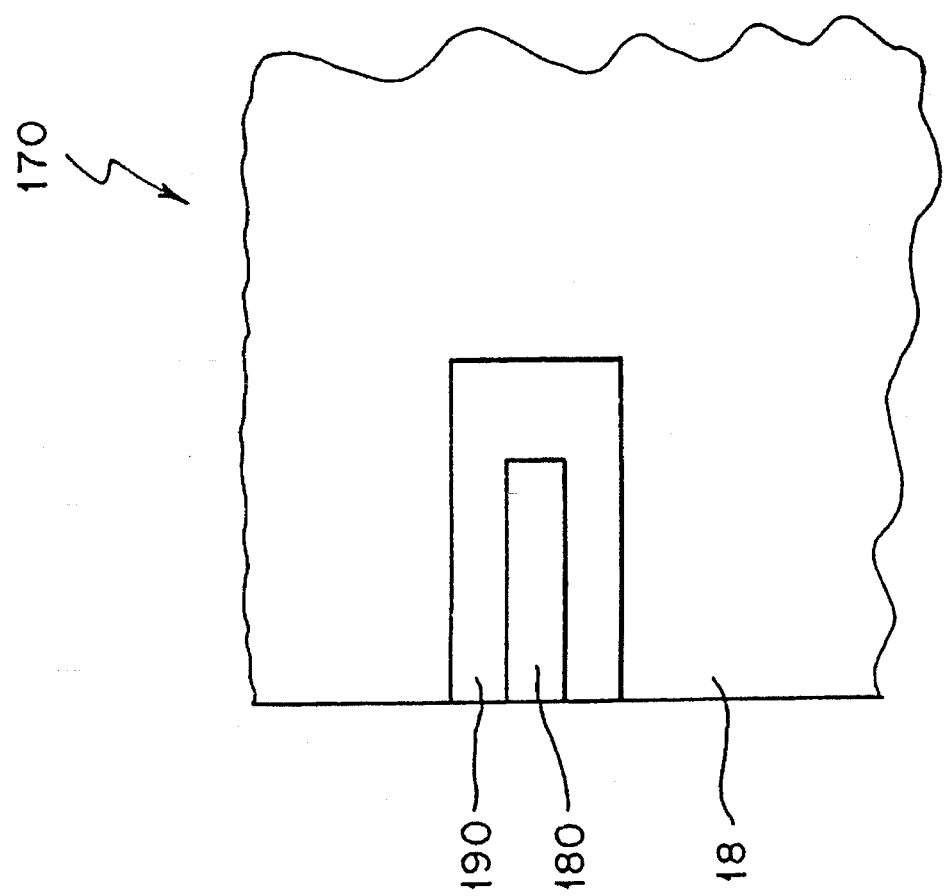

METHOD AND APPARATUS FOR THE INTERCONNECTION OF RADIO FREQUENCY (RF) MONOLITHIC MICROWAVE INTEGRATED CIRCUITS

This is a divisional of application Ser. No. 07/985,570, filed on Dec. 3, 1992, now U.S. Pat. No. 5,402,088.

FIELD OF THE INVENTION

Generally, this invention relates to circuit interconnection devices, and more particularly to the interconnection of monolithic microwave integrated circuit devices.

DESCRIPTION OF THE PRIOR ART

Technological advances in microelectronics, specifically in the area of monolithic microwave integrated circuit (MMIC) packaging, are rapidly reducing the size of radio frequency (RF) electronic assemblies. However, the interconnection technologies available to combine MMIC packages into complete electronic circuit assemblies have not progressed as rapidly with regard to miniaturization and efficiency as the MMIC packages themselves. As a result, the use of conventional interconnection technologies has negated many of the technological advances associated with MMIC technology.

Traditional methods for interconnecting MMIC packages include channelized microstrip and coplanar stripline. The MMIC input and output ports are compatible with both of these traditional interconnection technologies because the MMIC devices located on each MMIC package also use these transmission media. However, the aforementioned traditional interconnecting techniques suffer from electrical and mechanical shortcomings. Low insertion loss and high isolation of one signal from another are important requirements that are difficult to achieve with traditional interconnection techniques. However, these requirements can be met if the conductors are large in cross-section to achieve low loss, and are widely spaced in order to prevent unwanted signal coupling. A further drawback of conventional interconnection techniques is that in order to ensure that circuit isolation requirements are not violated, one conductor line should not cross another conductor line. These isolation requirements compel circuits which utilize MMIC packages and the traditional interconnection methods to be large. As a result of maintaining conductor line isolation, the MMIC circuit assemblies are not always able to take advantage of the size reduction inherent in the MMIC devices and packages.

OBJECTS AND SUMMARY OF THE INVENTION

It is an object of the present invention to provide apparatus and method for the interconnection of monolithic microwave integrated circuit devices.

It is another object of the present invention to provide apparatus and method for interconnecting miniature coaxial cable to monolithic microwave integrated circuit devices.

It is still another object of the present invention to provide apparatus which is capable of coupling to coaxial cable having an outer diameter that is smaller than those previously used yet the apparatus can effectively interconnect to MMIC packages.

It is yet another object of the present invention to provide a miniature coaxial cable interconnection system which allows MMIC packages to be placed very close together thereby minimizing electrical loss due to the conductor lines as well as maximizing the density of MMIC packages on a circuit board.

It is a further object of the present invention to provide a circuit board interconnection system for MMIC packages that permits conductor lines to be physically overlayed.

It is yet a further object of the present invention to provide a miniature coaxial cable interconnection system which provides maximum signal isolation.

It is yet another object of the present invention to provide a coaxial-to-coplanar waveguide transition apparatus for use in a miniature coaxial cable interconnection system.

It is yet another object of the present invention to provide a miniature coaxial cable interconnection system having coaxial-to-coplanar waveguide transition points that can be easily placed at chosen circuit locations.

It is yet another object of the present invention to provide an interconnection system and method of making the same which overcome the inherent disadvantages of known interconnection systems and methods.

A coaxial-to-coplanar waveguide connector, constructed in accordance with one form of the present invention, is used on a circuit board to connect miniature coaxial cable to stripline compatible devices such as MMIC packages. The connector is designed to interface the coaxial cable to a MMIC device so that electronic signals can be properly transmitted from the miniature coaxial cable to the MMIC device with little or no reflection of the signal. The coaxial-to-coplanar waveguide connector can be formed utilizing an end portion of a length of coaxial cable which is embedded within a dielectric circuit board.

In accordance with one form of the present invention, a coaxial-to-coplanar waveguide connector includes a connection section, an electrically conductive strip and an electrically conductive ribbon. The connection section of the coaxial-to-coplanar waveguide connector is substantially surrounded by a dielectric material that is placed upon the dielectric board. The connection section includes a center coaxial conductor portion, a dielectric portion and a shield portion. The connection section may be formed by horizontally cutting and removing the top-half of an end portion of the coaxial cable. The dielectric and shield portions which remain after the cutting and removing, generally have arc-like lateral cross-sections while the center coaxial conductor portion has a substantially semi-circular lateral cross-section. The shield portion substantially surrounds the outer arc of the dielectric portion and the dielectric portion surrounds the curved segment of the semi-circular center coaxial conductor portion. Preferably, the dielectric and shield portions are concentric about the center coaxial conductor portion.

The coaxial-to-coplanar waveguide connector further includes electrically conductive adjacent strips for coupling the shield portion of the coaxial-to-coplanar waveguide connector to a circuit board ground plane. The electrically conductive strips should be of sufficient size to also connect the circuit board ground plane to the MMIC package so that all circuit components have a common ground plane. The coaxial-to-coplanar waveguide connector also includes an electrically conductive ribbon which is attached to the center coaxial conductor portion. The electrically conductive ribbon should have sufficient size to couple an input/output connector of the MMIC package to the center coaxial conductor portion of the coaxial-to-coplanar waveguide connector.

In addition, a recess may be formed through the circuit board in order to provide a region adjacent to the connection section for placement of the MMIC package. When the MMIC package is placed within the recess and the conductive strips and conductive ribbon of the coaxial-to-coplanar waveguide connector are operatively connected to the MMIC package, an electrical signal can be properly transmitted between the coaxial cable and the MMIC device.

The present invention also includes a method for fabricating a coaxial-to-coplanar waveguide connector for use in interconnecting MMIC packages and miniature coaxial cable. A dielectric board has an adhesive material coated on it and a length of miniature coaxial cable is routed thereon. Thereafter, the dielectric board is plated with a layer of electrically conductive material, which provides a circuit board ground plane. The board is then coated with an additional dielectric substance to obtain a substantially flat, smooth and non-conductive top layer. In accordance with the method of the present invention, a relatively small region of the dielectric cable board containing an end of the length of coaxial cable is sectioned in order to remove a top portion of the dielectric board. Additionally, a top half portion of the miniature coaxial cable is removed to expose a substantially horizontal cross-section of the miniature coaxial cable including the center coaxial conductor, the dielectric layer and the outer coaxial shield, thereby forming a connection section. Furthermore, the milling process removes a sufficient amount of dielectric material in order to expose an area of the conductive layer adjacent to the connection section. A recess in the board adjacent to the end of the miniature coaxial cable is provided to allow for placement of the MMIC device.

The method further includes plating an electrically conductive strip to both the outer coaxial shield of the connection section and to the circuit board ground plane. An electrically conductive ribbon is connected to the exposed center conductor of the connection section. A MMIC package containing MMIC devices may then be placed within the dielectric circuit board recess and secured to a base plate which supports the entire dielectric circuit board. As a result, when the conductive ribbon is connected to an input/output port of the MMIC package, and when the conductive strip is connected to the ground plane of the MMIC package, an electrical signal can be properly transmitted between the miniature coaxial cable and the MMIC device with little or no signal reflection.

A preferred form of the coaxial-to-coplanar waveguide connector and the method for making the same, and the miniature coaxial cable system for the interconnection of radio frequency (RF) monolithic microwave integrated circuits (MMIC's) as well as other embodiments, objects, features and advantages of the invention will be apparent from the following detailed description of illustrative embodiments, which is to be read in connection with the accompanying drawings.

BRIEF DESCRIPTION OF THE DRAWINGS

FIG. 4A is a top plan view of an intermediate support pad formed in accordance with a second form of the present invention.

DETAILED DESCRIPTION OF THE PREFERRED EMBODIMENTS

Figure 1:
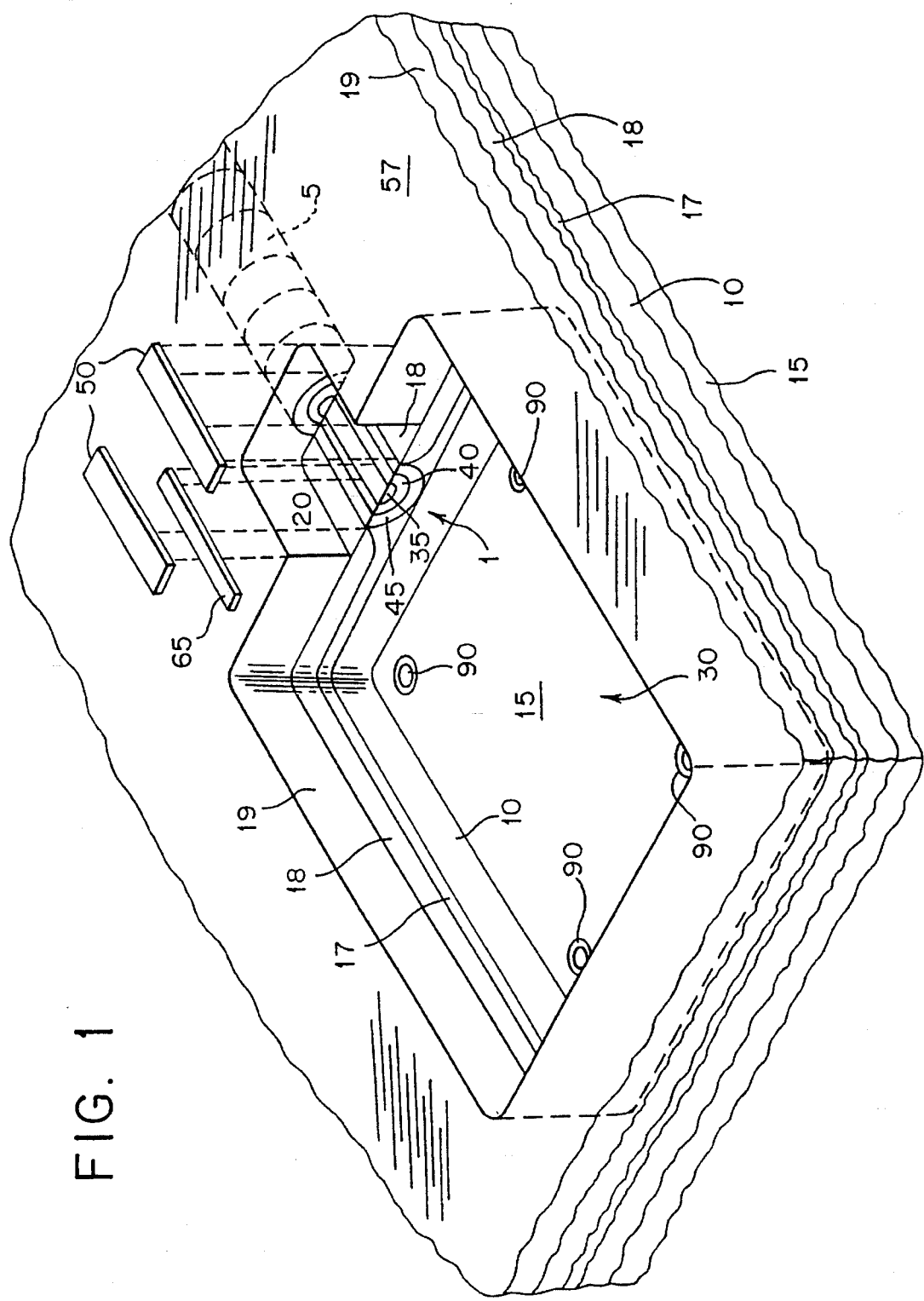
FIG. 1 is a perspective view of a coaxial-to-coplanar waveguide connector for coupling miniature coaxial cable to a MMIC package (not shown) formed in accordance with one form of the present invention.

Referring now to FIG. 1 of the drawings, a preferred form of the radio frequency (RF) monolithic microwave integrated circuit (MMIC) miniature coaxial cable (coax) to coplanar waveguide connector constructed in accordance with the present invention will now be described. The coaxial-to-coplanar waveguide connector 1 is preferably constructed from an end portion of miniature coaxial cable 5 which has been placed upon the surface of a dielectric board 10 and embedded within a circuit board assembly 57. The dielectric board 10 may be structurally supported by a metal base plate or substrate 15. The coaxial-to-coplanar waveguide connector 1 is preferably contained within a circuit board assembly 57 so as to minimize the board's overall thickness and in order to maintain compactness. The miniature coaxial cable 5, from which the coaxial-to-coplanar waveguide connector is formed, can be affixed to the dielectric board 10 in a variety of ways. A suitable way to secure the miniature coaxial cable 5 to the dielectric board 10 is by laying the miniature coaxial cable in a non-conductive adhesive material 17. Thereafter, a layer of conductive material 18 and dielectric material 19 are respectively coated to the entire dielectric board to form the assembly 57.

Figure 2:
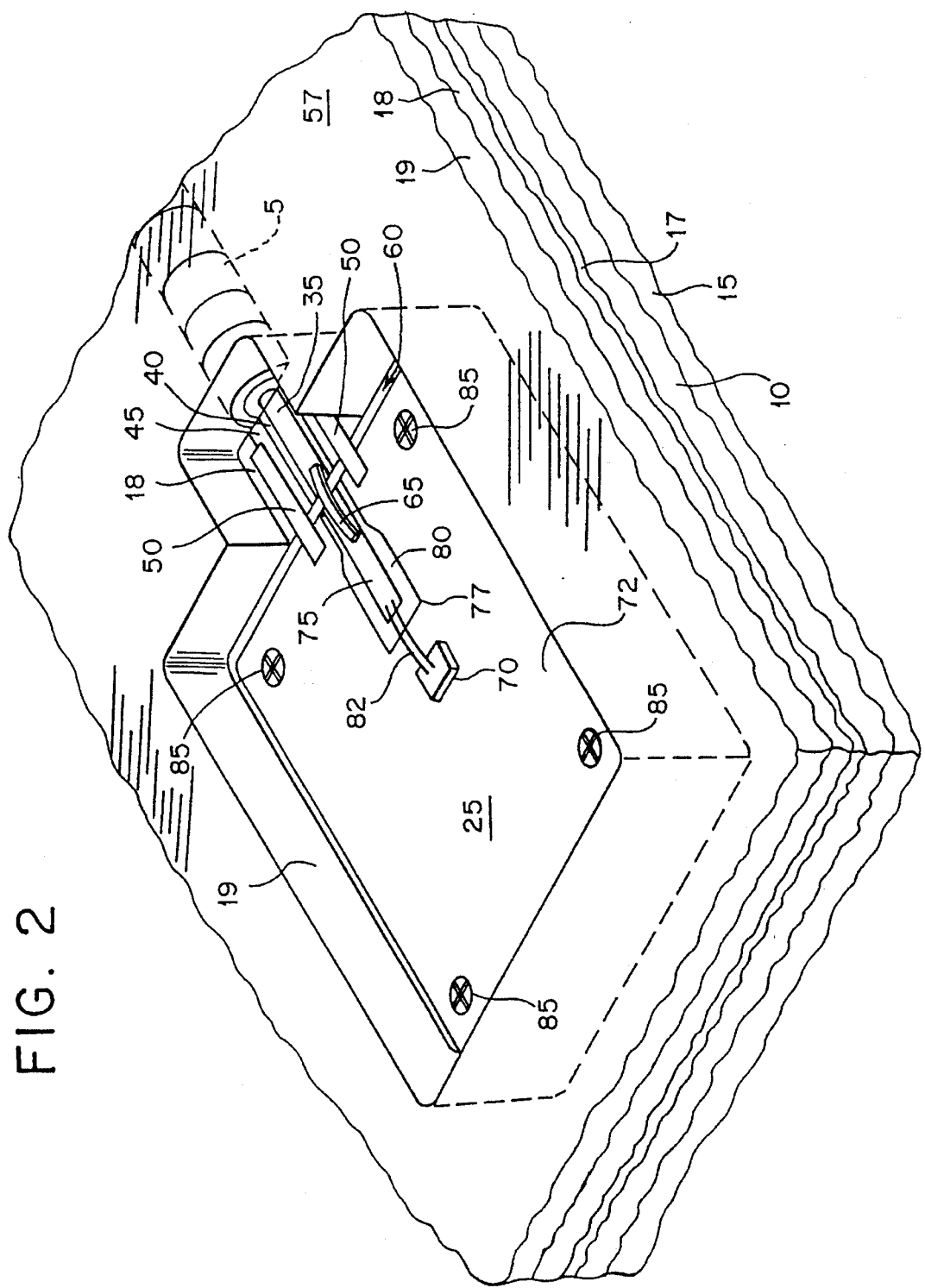
FIG. 2 is a perspective view of a coaxial-to-coplanar waveguide connector formed in accordance with the present invention shown in FIG. 1 and connected to a MMIC package which is contained within a circuit board recess.

The coaxial-to-coplanar waveguide connector 1 basically includes a connection section 20 for coupling miniature coaxial cable 5 embedded within the circuit board assembly 57 to a stripline compatible device such as a MMIC package 25 having at least one MMIC device 70 thereon. Preferably, the MMIC package 25 is contained within a circuit board recess 30 adjacent to the coaxial-to-coplanar waveguide connector as shown in FIG. 2. In a preferred embodiment, the connection section 20 is formed using an end length of miniature coaxial cable 5. The end of miniature coaxial cable 5 is horizontally cut in half and a top portion is removed so that only a bottom section of the cable having a substantially semi-circular lateral cross-section remains. In addition to removing a top portion of the miniature coaxial cable, portions of the top layer of dielectric material 19 adjacent to the connection section are removed in order to expose the circuit board ground plane 18 as shown in FIG. 1. Preferably, the top surface of the connection section is coplanar with the circuit board ground plane 18.

The connection section 20 is composed of three component parts. First, the connection section 20 has a center coaxial conductor portion 35 which preferably has a semi-circular lateral cross-section along its axial length. As shown in FIG. 1, the exposed top surface of the center conductor portion 35 is substantially flat and forms a segment of the top surface of the connection section 20.

The connection section 20 also contains a dielectric portion 40 which preferably has an arc-like lateral cross-section of uniform thickness. As shown in FIG. 1, the dielectric portion 40 surrounds the curved semi-circular part of the center conductor portion 35 so as to give the appearance that the center conductor portion 35 is supported by the dielectric portion 40. The connection section 20 may also have a shield portion 45, which also has an arc-like lateral cross-section. The shield portion 45 usually has a uniform thickness along its axial length. In the preferred embodiment, the shield portion 45 and the dielectric portion 40 are concentric about the center coaxial conductor portion 35 so as to form a coaxial line.

The coaxial-to-coplanar waveguide connector 1 also includes conductive strips 50, made of any one of a variety of conductive materials. Preferably, copper or gold foil is employed for the conductive strips because both materials are malleable, electrically conductive and readily bonded using microelectronic welding techniques. A first end of each conductive strip 50 is attached to both the exposed circuit board ground plane 18 and the shield portion 45 of the connection section 20. After a MMIC package 25 is placed within the recess 30, the second end of each strip 50 is attached to a MMIC package ground plane 72 as shown in FIG. 2. At any location on the circuit board assembly, the circuit board ground plane 18 may be connected to the metal base plate 15 or any other ground potential in order to provide a common ground potential to both the shield portion 45 and the MMIC package.

Figure 3:
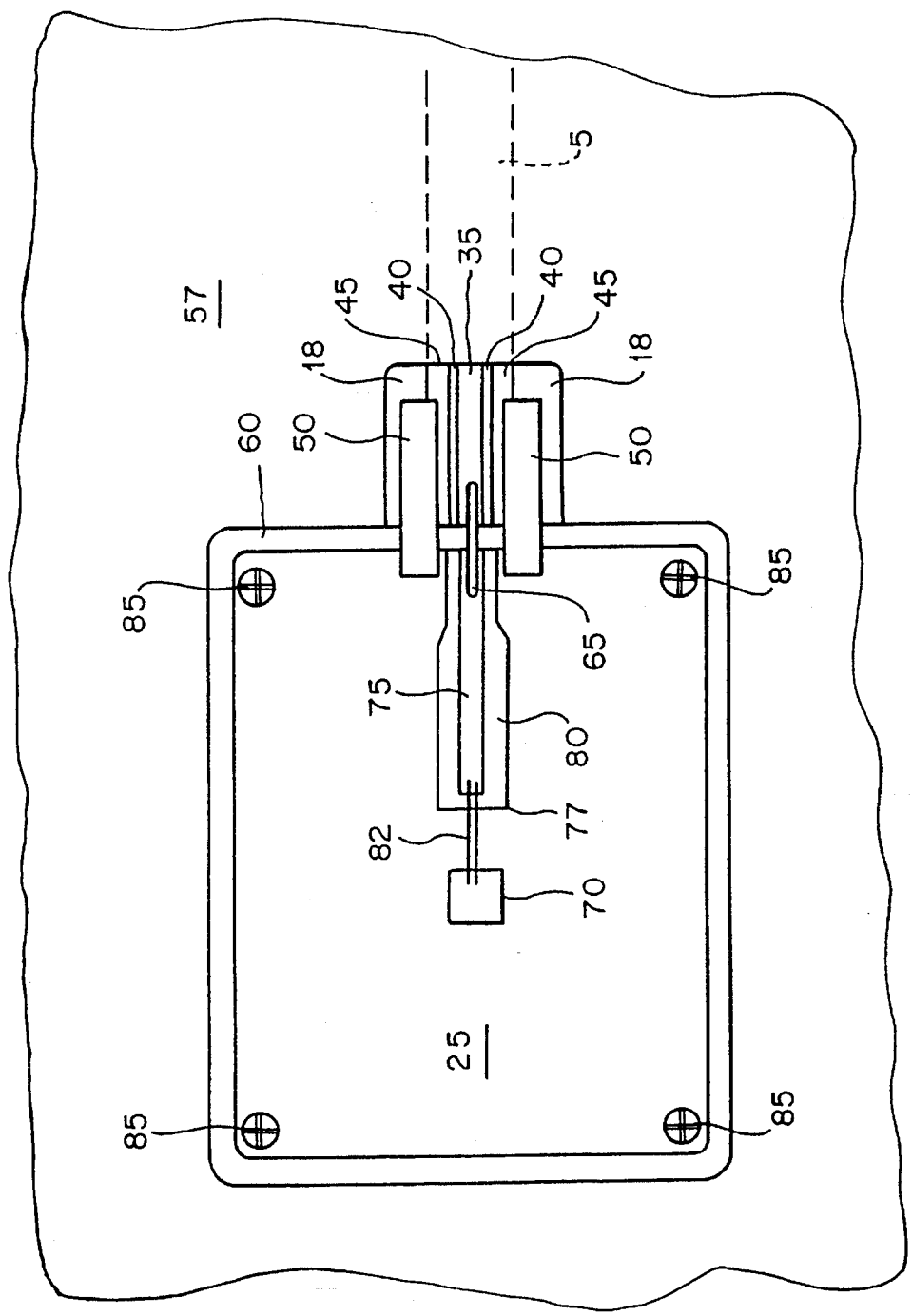
FIG. 3 is a top plan view of the coaxial-to-coplanar waveguide connector coupled to a MMIC package as shown in FIG. 2.

The conductive strips 50, which are attached to the ground plane 18 are preferably large enough to extend a sufficient length of the connection section 20 in order to ensure adequate coupling and grounding of the shield portion 45. As stated above, the conductive strips 50 should have sufficient length to extend from the outer shield portion 45 to a MMIC package 25 when the MMIC package is inserted within the recess 30. As shown in FIGS. 2 and 3, when the MMIC package 25 is placed adjacent to the connector within the recess 30, a relatively small gap 60 separates the MMIC package from both the side walls which define the circuit board recess 30 and the coaxial-to-coplanar waveguide connector 1. As a result, the conductive sheets 50 must extend across the gap 60 so that they may be electrically coupled to the MMIC package 25. The electrical coupling can be achieved by using microelectronic techniques such as welding, soldering or ultrasonic ribbon bonding.

The coaxial-to-coplanar waveguide connector 1 also includes a conductive ribbon 65 attached to the center coaxial conductor portion 35. The ribbon 65 is preferably made of a conductive, malleable metal such as gold or copper. As shown in FIGS. 2 and 3, when the MMIC package 25 is placed within the circuit board recess 30, the conductive ribbon should extend over the gap 60 which separates the MMIC package 25 and the connection section 20. When attached, the conductive ribbon 65 couples a conductive strip 75 of the MMIC package input/output connection 77 to the conductor portion 35 of the connector.

As shown in FIG. 1, the circuit board recess 30 is formed through the circuit board assembly 57, at a location which is adjacent to the coaxial-to-coplanar waveguide connector 1. FIG. 2 illustrates the MMIC package 25 having MMIC device 70, inserted within the circuit board recess 30. The circuit board recess 30 preferably extends a substantial amount through the circuit board assembly 57 so that the top surface of the MMIC package 25 is coplanar with the top surface of the connector. Furthermore, the circuit board recess 30 should be wide enough so that the MMIC package 25 can be easily placed therein. The only contact that the MMIC package should have with circuit board devices is by way of base plate 15, conductive ribbon 65 and conductive sheets 50.

As shown in FIGS. 2 and 3, the MMIC package 25 preferably includes an input/output connection 77 having a conductive strip 75 surrounded by dielectric material 80 on its top surface for connection to the MMIC device 70. The conductive ribbon 65, which is attached to the conductor portion 35 of the coaxial-to-coplanar waveguide connector, is bonded to the conductive strip 75 of the MMIC package 25 using standard microelectronic welding techniques. The conductive strip 75 is surrounded by a section of dielectric material 80 which serves to isolate the strip 75 from other regions of the MMIC package. The MMIC device 70 preferably has conductive leads 82 which attach to the conductive strip 75 of the input/output connection 77. Each MMIC package 25 may contain numerous MMIC devices 70 which may be coupled to different coaxial-to-coplanar waveguide connectors 1. As shown in FIGS. 2 and 3, the MMIC package 25 may include screws 85 which fit into screw holes 90 formed in the metal base plate 15 in order to secure the MMIC package 25 to the base plate 15. The screws 85 may also serve to couple appropriate portions of the MMIC package 25 to a ground potential reference such as the base plate. As previously stated, the coaxial-to-coplanar waveguide connector and recess 30 are designed so that when the MMIC package 25 is placed within the circuit board recess 30, the MMIC input/output connector 77 is substantially coplanar with the top surface of the connection section 20. Therefore, the conductive ribbon 65 can be easily connected from the connection section 20 to the MMIC package 25.

The dielectric board 10, which is utilized to support the coaxial-to-coplanar waveguide connector 1 and which forms a major component of the circuit board assembly 57, is principally constructed of a dielectric material such as epoxy-fiberglass, polyimide or Duroid™. In the alternative to the previously described configuration, the circuit board assembly 57 may contain the dielectric board 10 having a first ground plane (not shown in FIGS. 1–3), an adhesive layer 17 for securing the miniature coaxial cable 5 to the dielectric board 10, an intermediate metallic conductive layer 18 which forms a second ground plane, and a top layer of dielectric material 19.

Figure 1A:
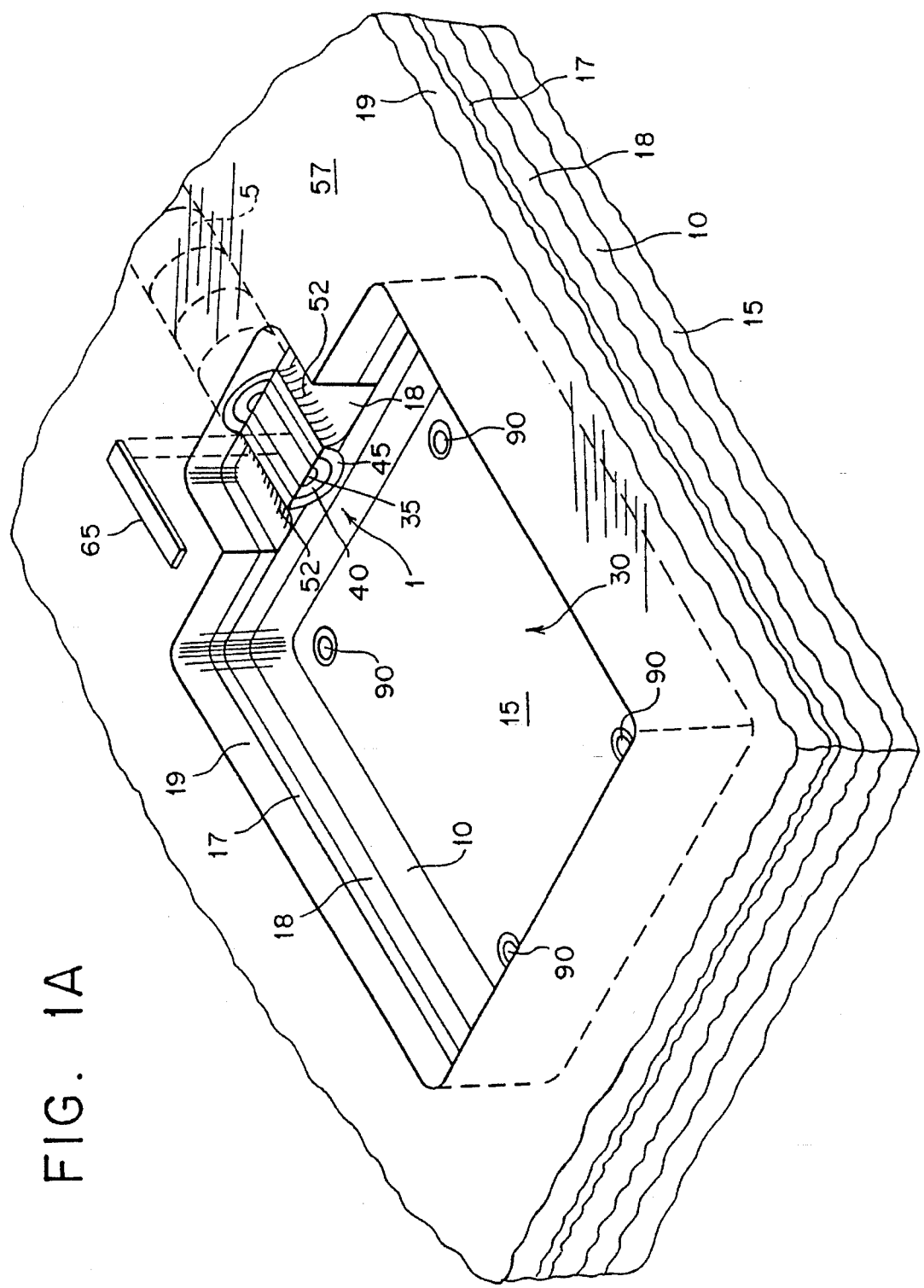
FIG. 1A is a perspective view of a coaxial-to-coplanar waveguide connector for coupling miniature coaxial cable to a MMIC package (not shown) formed in accordance with an alternative form of the present invention.

An alternative form of the coaxial-to-coplanar waveguide connector is shown in FIG. 1A. The connector is formed in a manner similar to that described with respect to FIG. 1. However, the miniature coaxial cable 5 is positioned within the circuit board assembly 57 so that when a top half portion of the cable 5 is removed to form a connection section, the top surface of the connection section is not coplanar with the circuit board ground plane 18. Therefore, solder fillet 52 is utilized to electrically couple the shield portion 45 to ground plane 18. Electrically conductive ribbon 65 is then bonded to the center coaxial conductor portion 35 for coupling to the MMIC package 25.

Figure 4:
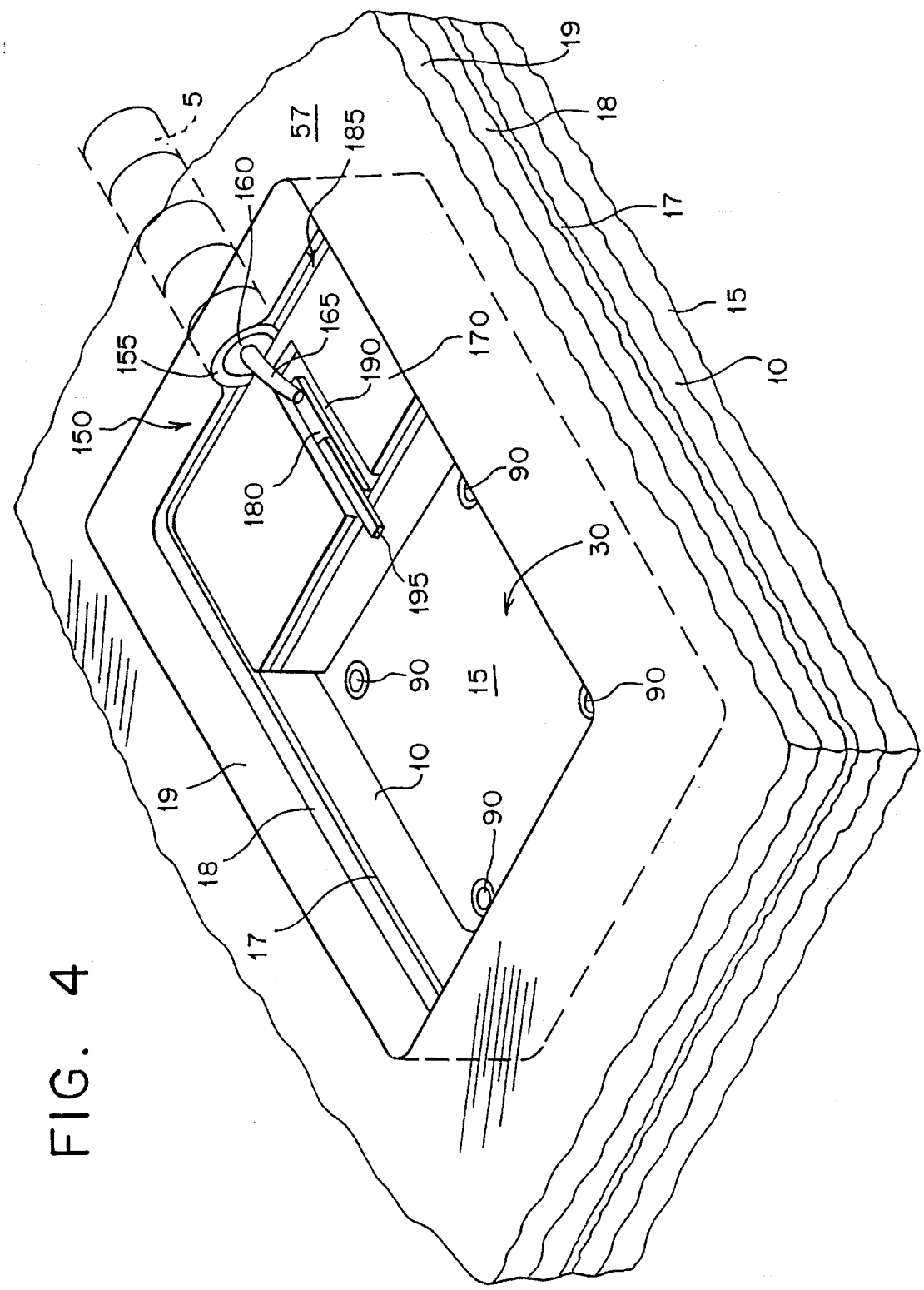
FIG. 4 is a perspective view of a coaxial-to-coplanar waveguide connector formed in accordance with a second form of the present invention for coupling coaxial cable to a MMIC package (not shown).
Figure 6:
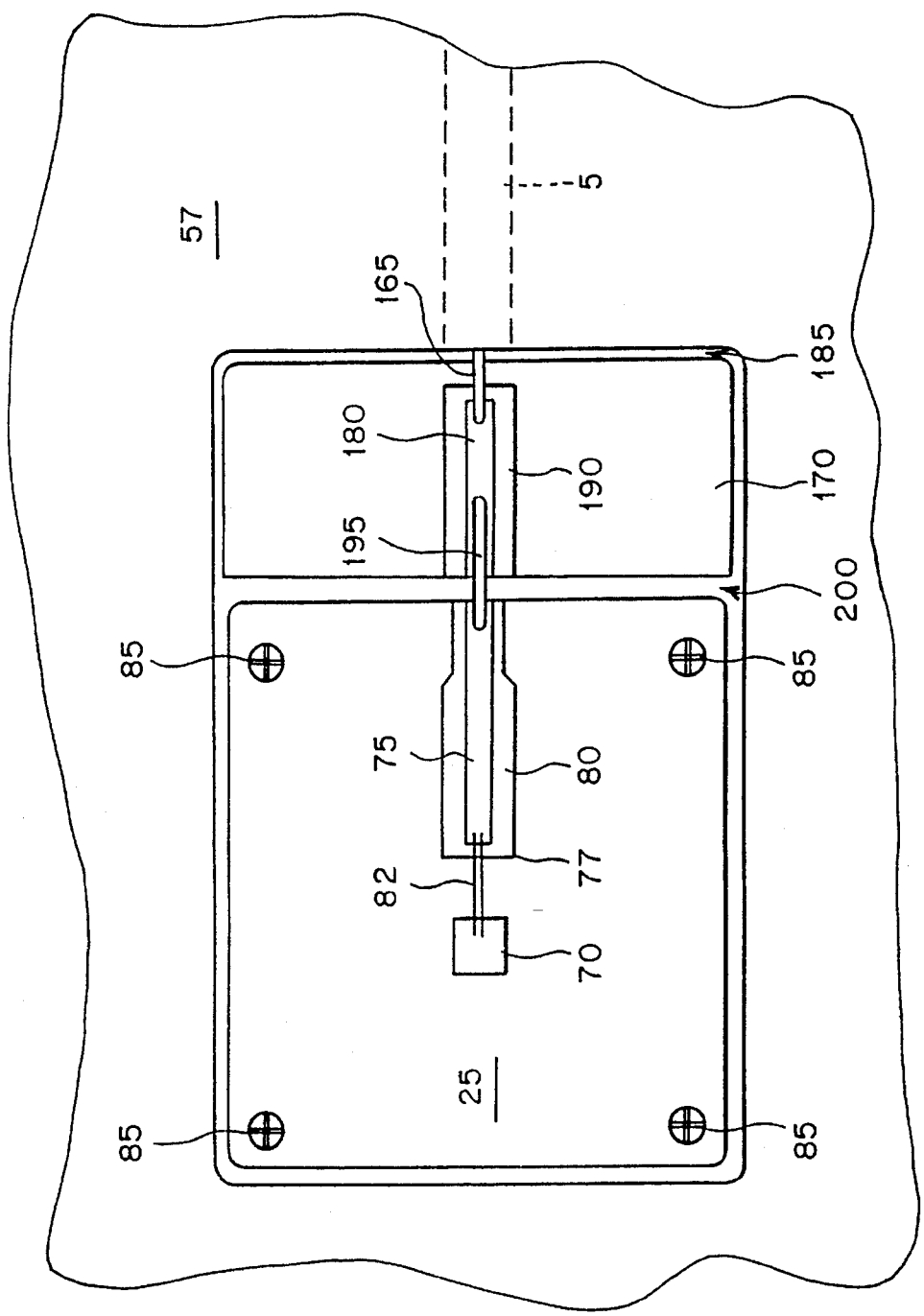
FIG. 6 is a top plan view of the coaxial-to-coplanar waveguide connector with intermediate support pad, coupled to a MMIC package as shown in FIG. 5.

An alternative form of the coaxial-to-coplanar waveguide connector 150 utilizing miniature coaxial cable 5 embedded within a circuit board assembly 57 is shown in FIG. 4. At an end of a length of the miniature coaxial cable 5, a shield portion 155 and dielectric portion 160 of the miniature coaxial cable 5 are removed circumferentially from about a coaxial center conductor by means including mechanical stripping, lasing or chemical etching to expose the center conductor of the miniature coaxial cable 5. The coaxial center conductor forms a conductor portion 165 of the coaxial-to-coplanar waveguide connector 150. The coaxial-to-coplanar waveguide connector 150 also includes an intermediate support pad 170 which is formed within the circuit board recess 30 adjacent to the end of miniature coaxial cable 5 as shown in FIG. 4. In a preferred embodiment, the conductor portion 165 axially protrudes and is contiguous with the center conductor of the miniature coaxial cable 5. In addition, the axis of the conductor portion 165 is substantially parallel to the top surface of the intermediate support pad 170. Furthermore, as shown in FIG. 6, the conductor portion 165 is substantially perpendicular with the side wall which defines the circuit board recess 30.

As shown in FIG. 4, the intermediate support pad 170 is preferably adjacent to the circuit board recess 30 and to the conductor portion 165. The intermediate support pad 170 may be made in a variety of ways. Preferably, as shown in FIGS. 4 and 4A, the pad is formed by removing portions of the dielectric top layer 19 of the circuit board assembly 57 in order to expose the circuit board ground plane 18. Thereafter, selected portions of the circuit board ground plane 18 are etched away so as to expose portions of the dielectric board 10 to form a "horseshoe configuration" as shown in FIG. 4A wherein a strip of conductive material 180, formally part of the circuit board ground plane 18, is surrounded by an area of dielectric material 190, which is a portion of the dielectric board 10. Then, the circuit board recess 30 is formed adjacent to the intermediate pad 170 by etching away all of circuit board ground plane 18, adhesive material 17 and dielectric board 10 to expose base plate 15 as shown in FIG. 4. The pad is electrically isolated from the circuit board assembly 57 by providing a gap 185 between the sidewalls which define the circuit board recess and the intermediate pad 170.

Figure 5:
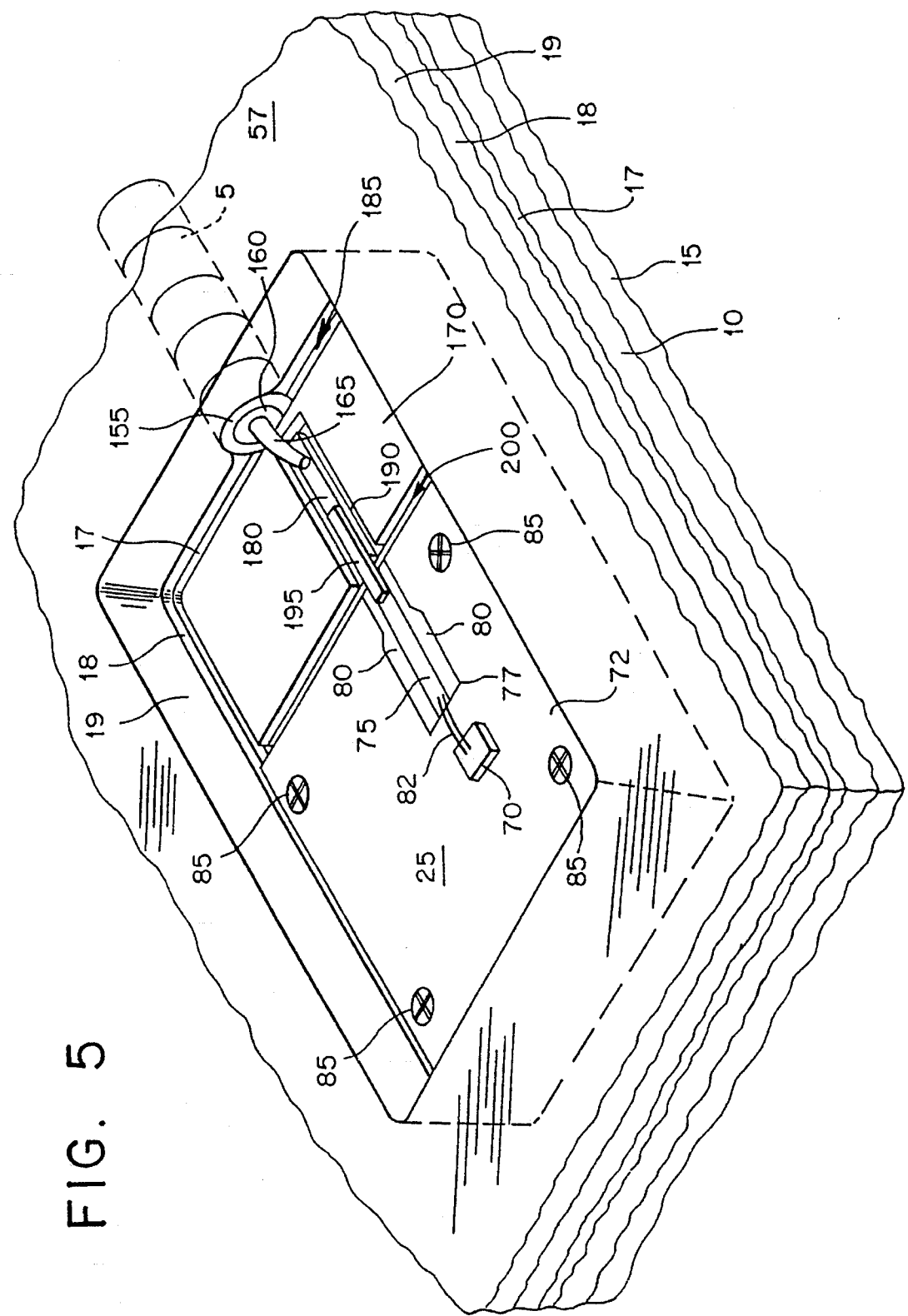
FIG. 5 is a perspective view of a coaxial-to-coplanar waveguide connector formed in accordance with the second form of the present invention coupled to a MMIC package which is contained within a circuit board recess.
Figure 7:
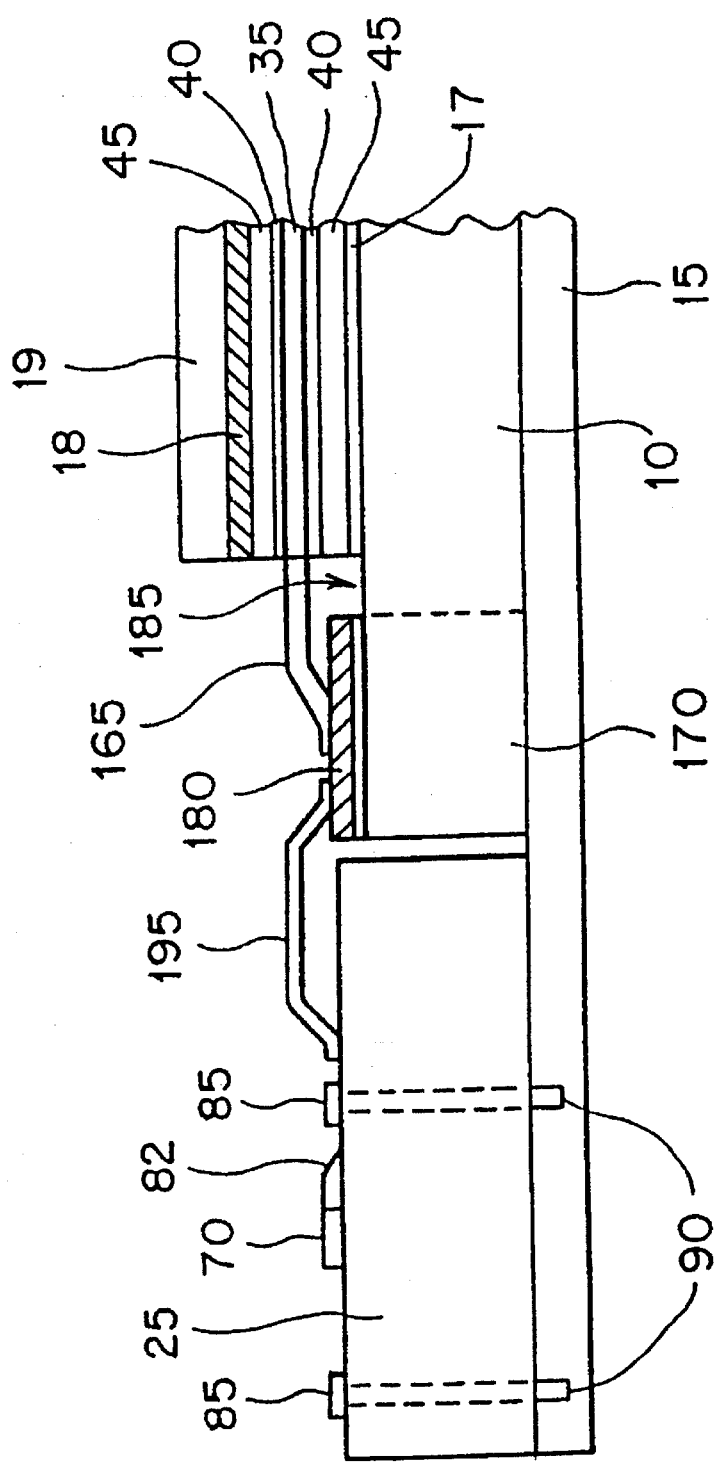
FIG. 7 is a cross-sectional view of the coaxial-to-coplanar waveguide connector shown in FIG. 5.

FIG. 7 shows a cross-sectional view of the coaxial-to-coplanar waveguide connector and MMIC package 25 shown in FIG. 5. This figure shows portions of the circuit board assembly 57 removed to expose ground plane 18. The ground plane 18 forms a portion of the surface of the intermediate support pad 170 as previously described. The ground plane 18 is electrically isolated from other portions of the circuit board by etching through the ground plane 18 to provide gap 185 which substantially surrounds pad 170. In order to provide the desired conductive strip arrangement, segments of the ground plane 18 which form the top surface of the intermediate support pad 170 are removed by etching or lasing so that a conductive strip 180 of ground plane remains. This arrangement substantially forms a coplanar waveguide center conductor 180. The conductive strip 180 has a dielectric material 190 (corresponding to a portion of the dielectric circuit board 10) on its right, left and rear sides after portions of the ground plane 18 are removed. This arrangement of the intermediate pad is commonly referred to as a coplanar stripline arrangement.

As shown in FIG. 4, a conductive ribbon 195 is connected to the conductive strip 180 of the intermediate support pad 170. The top surface of the intermediate support pad 170 should be substantially coplanar to the conductor portion 165 so that the conductor portion 165 can be easily attached to the conductive strip 180 of the intermediate support pad 170. Additionally, for easy attachment, it is preferred to have the coplanar waveguide center conductor 180 substantially axially aligned with the conductor portion 165.

As shown in FIGS. 5 and 6, the MMIC package 25 and the intermediate pad 170 are not contiguous. Therefore, the conductive ribbon 195 that is coupled to the conductive strip 180 of the intermediate support pad 170 must bridge gap 200 located between the intermediate support pad 170 and the MMIC package 25. The coaxial-to-coplanar waveguide connector arrangement serves to match the impedance of the MMIC input/output connection 77 so that an electrical signal can be properly transmitted from the miniature coaxial cable 5 to the MMIC package 25 with minimal or no reflection of signal energy.

Figure 8:
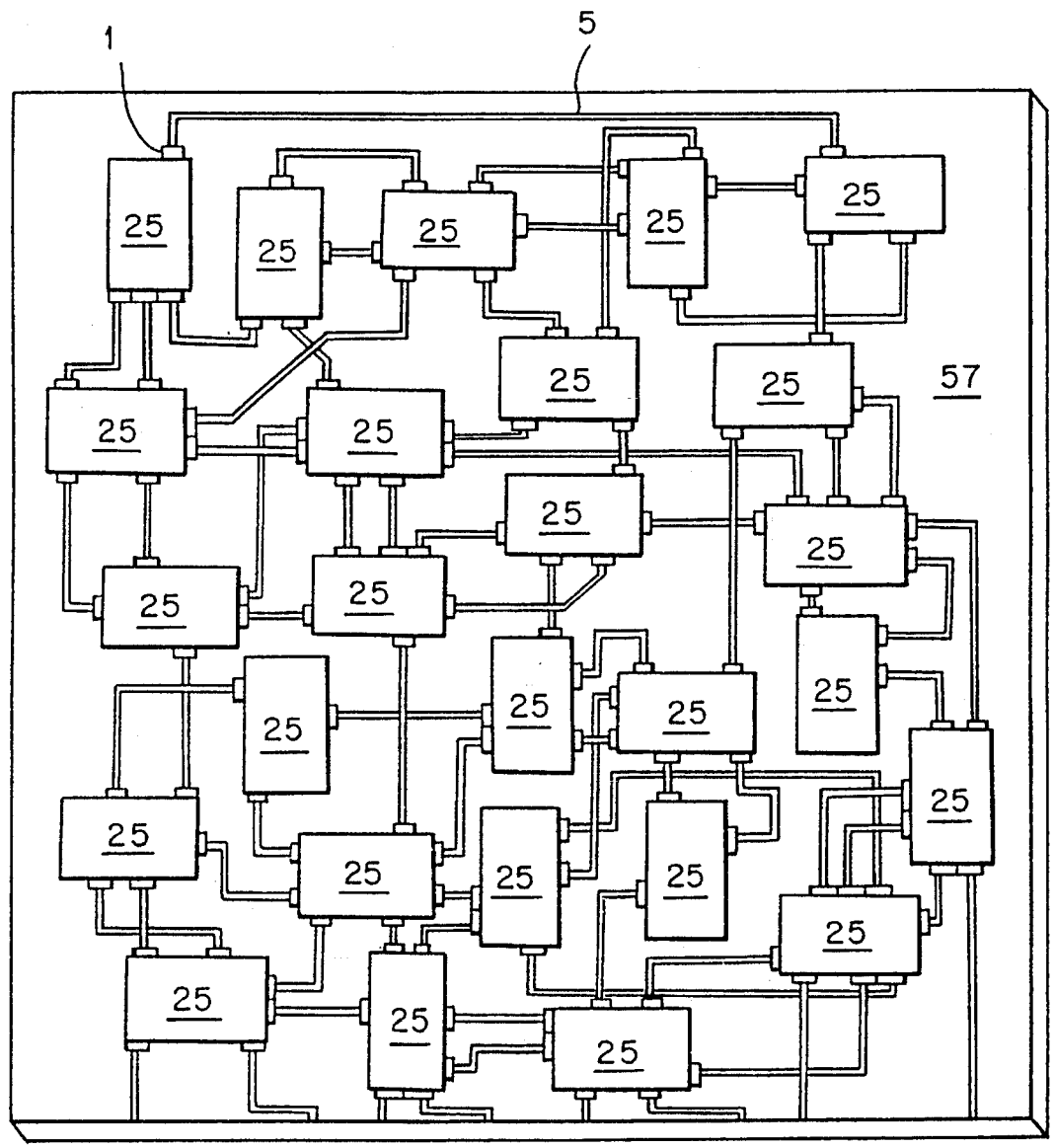
FIG. 8 is a top plan view of an electronic circuit board having a plurality of MMIC packages and showing the interconnection with miniature coaxial cable and coaxial-to-coplanar waveguide connectors.

As shown in FIG. 8, the present invention is designed to permit miniature coaxial cable 5 to be coupled to numerous coaxial-to-coplanar waveguide connectors 1 in order to interconnect a plurality of selected MMIC packages 25 and their corresponding MMIC devices 70. This may be accomplished by terminating a first end of a length of miniature coaxial cable using one of the above-described configurations. Thereafter, one of the plurality of MMIC packages 25 is electrically coupled to the coaxial-to-coplanar waveguide connector. Furthermore, a second end of the length of miniature coaxial cable 5 is terminated using one of the above-described configurations and coupled to another MMIC package 25. As a result, the MMIC devices 70 of the MMIC packages 25 may be electrically interconnected via the miniature coaxial cables. The diameter of the miniature coaxial cable 5 which is used is preferably in the range of approximately 0.010" to 0.025" in order to ensure the smallest possible circuit board assembly. As previously mentioned, the miniature coaxial cable may be laid on top of the dielectric board 10 and embedded within the circuit board assembly 57.

FIG. 8 illustrates the benefits of utilizing the connector of the present invention to interconnect MMIC packages 25 and their corresponding MMIC devices 70 with miniature coaxial cable 5 rather than with traditional methods. FIG. 8 shows MMIC packages 25 interconnected by miniature coaxial cables 5 which can be routed as needed, even being crossed or laid parallel to one another. Cable crossing can occur because the miniature coaxial cable 5 is metal jacketed which provides signal isolation. In addition, the close spacing and cross-routing of the miniature coaxial cable 5 permits the MMIC packages 25 to be placed very close together, thereby minimizing the electrical loss between circuit devices which is usually caused by the electrical connection lines. Furthermore, utilizing the coaxial-to-coplanar waveguide connectors 1 of the present invention with miniature coaxial cable enables all of the outer coaxial shields 45 of the miniature coaxial cable 5 to be coupled together to form a single common ground plane. This can improve the shielding properties of the final circuit. As a result of having a common ground plane in conjunction with the improved shielding properties, signal fidelity is preserved and a more accurate reproduction of the signal is realized as compared to the prior art interconnection methods.

The coaxial-to-coplanar waveguide connector of the present invention may be fabricated during or after the manufacture of a circuit board assembly 57, such as one substantially made of a glass-epoxy composition having single or dual ground planes, and having miniature coaxial cable mounted thereon. The method of manufacturing such a circuit board assembly 57 includes covering the top surface of the dielectric board 10 with a layer of adhesive material 17. Thereafter, miniature coaxial cable 5 is appropriately routed on the dielectric board 10 in accordance with the desired circuit design. The miniature coaxial cable 5 is secured to the dielectric board by the adhesive material. The miniature coaxial cable 5 is routed on top of the dielectric board 10 so that when MMIC packages 25 are included on the board, corresponding MMIC devices 70 which are intended to be interconnected will be interconnected by the miniature coaxial cable 5. Thereafter, the dielectric board 10 including the miniature coaxial cable 5 routed thereon, is plated with a conductive layer of material to provide a circuit board ground plane 18. A generous amount of dielectric material 19 is then used to coat and cover the circuit board ground plane 18. The dielectric material 19 is applied over the circuit board ground plane 18 and the embedded miniature coaxial cable 5 so that all surface projections and recesses are covered and filled in order to provide a substantially flat and level top surface of dielectric material 19.

In order to produce the coaxial-to-coplanar waveguide connector, a milling machine may be utilized to remove a top portion of the circuit board assembly 57 including a substantially top half portion of an end segment of the embedded miniature coaxial cable 5. The top layer of dielectric material 19 adjacent to the connector should also be removed so that only a layer of conductive material 18 remains as shown in FIG. 1. The center conductor 35, the dielectric 40 and the outer shield 45 of the bottom half portion of the miniature coaxial cable are exposed after the top half of the coaxial cable end is removed.

The method further includes removing a section of the circuit board assembly 57 adjacent to the end of the miniature coaxial cables to provide a circuit board recess 30. This may be accomplished by means of a milling machine or a punch press. A MMIC package 25 may then be inserted within the circuit board recess 30. As shown in FIG. 2, the MMIC package is preferably attached to a base plate 15 located below the circuit board in order to secure and ground the MMIC package. Conductive strips 50 may then be plated to the outer shield 45 of the milled miniature coaxial cable 5. As shown in FIG. 1, this may be performed on both sides of the connection section 20. The conductive strips 50 couple the outer shield 45 of the miniature coaxial cable 5 to the conductive layer 18 adjacent to the connector. Furthermore, conductive ribbon 65 is plated to the exposed center conductor 35 of the milled miniature coaxial cable 5. Once the MMIC package 25 is secured in the recess, the conductive ribbon 65 can be plated to the conductive strip 75 of the MMIC package input/output connector 77 so as to bridge the space 60 as shown in FIG. 2. Thereafter, the conductive strips 50 are plated to the MMIC package 25 in order to couple the MMIC package 25 to the circuit board ground plane 18.

An alternative form of the coaxial-to-coplanar waveguide connector may also be produced. After routing the miniature coaxial cable 5 in adhesive material 17 on the dielectric board 10, and covering the miniature coaxial cable 5 with a layer of conductive material which functions as a circuit board ground plane 18, and adding dielectric material 19 to obtain a substantially non-conductive smooth top surface, each connector may be formed by removing, such as chemical etching, a section of the top layer of dielectric material 19 and the circuit board ground plane 18 surrounding an end portion of the miniature coaxial cable 5. The chemical etching process substantially exposes an end length of the miniature coaxial cable 5. Thereafter, another portion of the circuit board assembly 57 is chemically etched or milled to remove portions of the circuit board assembly 57 adjacent to the end of the miniature coaxial cable 5 in order to provide a substantially flat surface corresponding to the top surface of the pad 170 as shown in FIG. 4. The intermediate support pad 170 is formed from the circuit board dielectric material 10 with an additional conductive strip 180 thereon. The conductive strip 180 may be separately mounted, along with surrounding dielectric material, on the top surface of the intermediate pad. In the alternative, when the pad is formed, dielectric material 19 is substantially removed so as to expose the ground plane 18. The conductive strip 180 of the intermediate pad 170 can be formed by etching portions of the circuit board ground plane 18 as shown in FIGS. 4 and 4A. The conductive strip 180 is formed on the surface of the intermediate pad by removing portions of the ground plane 18 on opposite sides of a center portion of the top surface of the pad with a laser. As a result, dielectric material 10 is adjacent to conductive strip 180 which is consistent with the configuration of the top surface of the intermediate pad as shown in FIG. 6.

The method further includes removing a predetermined axial length of the coaxial shield portion 155 in order to expose the dielectric portion 160 of the miniature coaxial cable 5. Then, the dielectric portion 160 of the miniature coaxial cable is chemically etched in order to circumferentially remove and expose the center conductor 165 of the length of miniature coaxial cable 5. After the center conductor 165 has been exposed, it is plated to a first end of the conductive strip 180 of the intermediate pad 170. Thereafter, an electrically conductive ribbon 195 is attached to the opposite end of the conductive strip 180. The electrically conductive ribbon is preferably made of a ductile metallic material so that it can be easily manipulated and attached to the MMIC package 25 using standard microelectronic bonding techniques.

Thereafter, a predetermined section of the circuit board assembly 57 that is adjacent to the intermediate support pad 170 is removed in order to provide a circuit board recess 30. Then, as previously described, a MMIC package 25 may be placed within the circuit board recess 30 and secured to the supporting base plate 15.

In order to connect a MMIC package 25 to the coaxial-to-coplanar waveguide connector, the electrically conductive ribbon 195, that has previously been connected to the conductive strip 180 of intermediate support pad 170, is coupled to the conductor 75 of the MMIC input/output connection 77. As a result, an electrical signal may be transmitted between the miniature coaxial cable 5 and the MMIC package 25 through the coaxial-to-coplanar waveguide connector 1 with minimal reflection of signal energy.

The above-described process may be performed on any portion of the length of miniature coaxial cable 5 that is laid upon the dielectric board 10. This may be accomplished by providing the circuit board recess 30 in the middle of a length of miniature coaxial cable 5. As a result, an end portion of the miniature coaxial cable 5 is produced and a coaxial-to-coplanar waveguide connector 1 can be formed.

As shown in FIG. 8, if desired, a MMIC device 25 may be operatively coupled to more than one coaxial-to-coplanar waveguide connector 1.

As a result of using the connector of the present invention to interconnect selected MMIC's with miniature coaxial cable 5, the MMIC's may be placed very close together. The miniature coaxial cable does not have the topological limitations inherent in other interconnection techniques such as channelized microstrip and coplanar stripline. The connector of the present invention, which occupies very little space, allows high density placement of the MMIC's on the circuit board. The topologically limited prior interconnection techniques result in the dispersion of the MMIC's on the dielectric circuit board. This increases the size of the overall circuit and creates an inability to take advantage of the size reduction qualities inherent in the MMIC devices and MMIC packages. By being able to utilize miniature coaxial cable 5 to interconnect the MMIC's, the MMIC packages may be placed very close together, thereby minimizing the electrical loss between each device. Furthermore, since the miniature coaxial cable 5 has an outer protective shield or metal jacket, the cable may be physically routed and laid upon other coaxial cables and still provide signal isolation. If needed, the miniature coaxial cable can be laid next to other coaxial cables with zero spacing. This zero space routing is not practical with channelized microstrip, coplanar stripline or other interconnection techniques.

A significant feature of the above described invention is that by means of the unique coaxial-to-coplanar waveguide connector, each MMIC package 25 may be easily mounted and closely spaced at appropriate locations on the circuit board assembly 57 and ribbon bonded to an appropriate connector. In addition, as a result of the above-described compactness, improved signal accuracy and fidelity can be achieved with an extremely thin (approximately 0.060") circuit board having excellent interconnect properties. It has been shown that since the MMIC-coax connector simplifies the interconnection of MMIC's with miniature coaxial cable 5, circuit volume may be reduced by 30–60%, while improving electrical performance and reducing manufacturing cost.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A method of fabricating a coaxial-to-coplanar waveguide connector for interconnecting microwave integrated circuit devices with miniature coaxial cable on a dielectric board, the method comprising:

a) coating the dielectric board with an adhesive material;

b) routing a length of miniature coaxial cable in the adhesive material to fabricate a dielectric cable board;

c) plating the dielectric cable board with a conductive material;

d) coating the conductive material with a dielectric material;

e) removing a region of the dielectric cable board containing a length of miniature coaxial cable to remove a top portion of the dielectric cable board and to expose a substantially horizontal cross-section of the miniature coaxial cable including the center conductor, the dielectric and the outer coaxial shield;

f) mounting a first electrically conductive means on at least a portion of the outer coaxial shield of the miniature coaxial cable and to the conductive layer of material within the dielectric board; and g) mounting an end of a second electrically conductive means on a portion of the exposed center conductor of the miniature coaxial cable.

2. A method of fabricating a coaxial-to-coplanar waveguide connector for interconnecting microwave integrated circuit devices with miniature coaxial cable on a dielectric board of a circuit board assembly, the method comprising:

a) coating the top surface of the dielectric board with an adhesive material;

b) routing a length of miniature coaxial cable in the adhesive material to fabricate a dielectric cable board;

c) plating the dielectric cable board with a conductive material;

d) coating the conductive material with a dielectric material in order to obtain a substantially flat top surface;

e) removing a first portion of the dielectric cable board including segments of the dielectric and conductive material to expose an end portion of a length of miniature coaxial cable;

f) removing a second portion of the dielectric cable board including the dielectric material to expose the layer of conductive material and to provide a first surface which defines an intermediate pad;

g) removing a third portion of the dielectric cable board adjacent to the first surface including the dielectric material, conductive and adhesive layers and dielectric board to provide interior side walls of the circuit board assembly, the interior side walls defining a recessed portion of the circuit board assembly;

ह) providing a conductive material on the first surface;

i) removing a predetermined axial length of the outer coaxial shield of the miniature coaxial cable so as to circumferentially expose the dielectric of the miniature coaxial cable;

j) removing a predetermined axial length of the dielectric of the miniature coaxial cable in order to circumferentially expose a predetermined axial length of the center conductor;

k) mounting a portion of the exposed center conductor of the miniature coaxial cable on the conductive material of the intermediate pad; and l) mounting a portion of an electrically conductive means on the conductive material of the intermediate pad for connection to a microwave integrated circuit device.

3. A method of interconnecting microwave integrated circuit devices on a dielectric board, the method comprising:

a) coating the dielectric board with an adhesive material;

b) routing a length of miniature coaxial cable in the adhesive material to fabricate a dielectric cable board;

c) plating the dielectric cable board with a conductive material;

d) coating the conductive material with a dielectric material to obtain a substantially flat top surface;

e) removing a region of the dielectric cable board containing a length of miniature coaxial cable to expose a substantially horizontal cross-section of the miniature coaxial cable including the center conductor, the dielectric and the outer coaxial shield;

f) removing a predetermined section of the dielectric cable board adjacent to the exposed horizontal cross-section of the miniature coaxial cable to provide a hole therethrough;

g) plating a first electrically conductive means to the outer coaxial shield of the miniature coaxial cable and to the conductive layer of material on the dielectric board;

h) plating an end of a second electrically conductive means to the exposed center conductor of the miniature coaxial cable;

i) inserting the microwave integrated circuit device within the dielectric board hole, the microwave integrated circuit device being supported by a metal base plate adjoining the dielectric cable board; and j) electrically coupling the exposed center conductor of the coaxial cable to the microstrip integrated circuit device and electrically coupling the outer coaxial shield of the miniature coaxial cable to the ground plane of the microwave integrated circuit device.

4. A method of interconnecting microwave integrated circuit devices on a dielectric board, the method comprising:

a) coating the dielectric board with an adhesive material;

b) routing a length of miniature coaxial cable in the adhesive material to fabricate a dielectric cable board;

c) plating the dielectric cable board with a conductive material;

d) coating the conductive material with a dielectric material in order to obtain a substantially flat surface;

e) removing a first portion of the dielectric cable board including the dielectric and conductive material to expose an end portion of a length of miniature coaxial cable;

f) removing a second portion of the dielectric cable board including the dielectric material and the conductive and adhesive layers to provide a recessed portion having a recessed first surface substantially surrounding a second surface, the second surface defining an intermediate pad;

g) providing a conductive material on the second surface;

h) removing a predetermined axial length of the outer coaxial shield of the miniature coaxial cable so as to circumferentially expose the dielectric of the miniature coaxial cable;

i) removing a predetermined axial length of the dielectric of the miniature coaxial cable in order to circumferentially expose a predetermined axial length of the center conductor;

j) mounting a portion of the exposed center conductor of the miniature coaxial cable on the conductive material of the intermediate pad;

k) mounting a portion of an electrically conductive means on the conductive material of the intermediate pad;

l) removing a predetermined portion of the dielectric cable board adjacent to the intermediate pad to provide a hole therethrough;

m) inserting a microwave integrated circuit device within the dielectric cable board hole; and n) electrically coupling the microwave integrated circuit device to the intermediate pad.

* * * * *